US010031191B1

(12) United States Patent
Nguyen et al.

(10) Patent No.: US 10,031,191 B1
(45) Date of Patent: Jul. 24, 2018

(54) PIEZOELECTRIC MAGNETOMETER CAPABLE OF SENSING A MAGNETIC FIELD IN MULTIPLE VECTORS

(71) Applicant: HRL Laboratories, LLC, Malibu, CA (US)

(72) Inventors: Hung Nguyen, Los Angeles, CA (US); Logan D. Sorenson, Calabasas, CA (US); Raviv Perahia, Calabasas, CA (US); David T. Chang, Calabasas, CA (US); Joshua A. Erbland, Brockport, NY (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/997,423

(22) Filed: Jan. 15, 2016

Related U.S. Application Data

(63) Continuation-in-part of application No. 14/628,182, filed on Feb. 20, 2015.

(60) Provisional application No. 62/104,227, filed on Jan. 16, 2015.

(51) Int. Cl.
*G01R 33/028* (2006.01)

(52) U.S. Cl.
CPC ................................ *G01R 33/0286* (2013.01)

(58) Field of Classification Search
CPC .................................................. G01R 33/0286
See application file for complete search history.

(56) References Cited

U.S. PATENT DOCUMENTS

| | | | |
|---|---|---|---|
| 392,650 | A | 11/1888 | Watrous |
| 2,487,165 | A | 11/1949 | Miller |
| 3,390,287 | A | 6/1968 | Sonderegger |
| 3,702,073 | A | 11/1972 | Jacobs |
| 3,766,616 | A | 10/1973 | Staudte |
| 4,364,016 | A | 12/1982 | Tanski |
| 4,426,769 | A | 1/1984 | Grabbe |
| 4,442,574 | A | 4/1984 | Wanuga |
| 4,447,753 | A | 5/1984 | Ochiai |
| 4,618,262 | A | 10/1986 | Maydan |

(Continued)

FOREIGN PATENT DOCUMENTS

| | | |
|---|---|---|
| DE | 44 42 033 | 5/1996 |
| DE | 19719601 | 11/1998 |

(Continued)

OTHER PUBLICATIONS

From U.S. Appl. No. 14/628,182 (unpublished, non publication requested), Office Action dated Dec. 9, 2016.

(Continued)

*Primary Examiner* — Minh Phan
*Assistant Examiner* — Zannatul Ferdous
(74) *Attorney, Agent, or Firm* — Ladas & Parry

(57) ABSTRACT

A magnetometer comprising a resonating structure which is naturally resonant in at least three resonant modes, a resonant frequency of the three modes being sufficiently separated to allow of detection of same, the resonating structure having two sense electrodes disposed on opposing major surfaces of the resonating structure and having a conductive path formed as a loop, the loop being disposed near or at edges of the resonating structure and the two sense electrodes being formed inwardly of the edges of the resonating structure and also inwardly of the loop.

21 Claims, 7 Drawing Sheets

Single die package with multi-axis magnetometer

(56) References Cited

U.S. PATENT DOCUMENTS

| | | | |
|---|---|---|---|
| 4,870,313 A | 9/1989 | Hirama et al. | |
| 4,898,031 A | 2/1990 | Oikawa et al. | |
| 4,944,836 A | 7/1990 | Beyer et al. | |
| 5,085,079 A | 2/1992 | Holdren | |
| 5,203,208 A | 4/1993 | Bernstein | |
| 5,226,321 A | 7/1993 | Varnham | |
| 5,260,596 A | 11/1993 | Dunn et al. | |
| 5,311,198 A | 5/1994 | Sutton | |
| 5,421,312 A | 6/1995 | Dawson | |
| 5,480,747 A | 1/1996 | Vasudev | |
| 5,530,408 A | 6/1996 | Vig et al. | |
| 5,552,016 A | 9/1996 | Ghanayem | |
| 5,578,976 A | 11/1996 | Yao et al. | |
| 5,589,724 A | 12/1996 | Satoh et al. | |
| 5,596,243 A | 1/1997 | Tsuru | |
| 5,604,312 A | 2/1997 | Lutz | |
| 5,605,490 A | 2/1997 | Laffey et al. | |
| 5,644,083 A | 7/1997 | Newell | |
| 5,644,139 A | 7/1997 | Allen | |
| 5,646,346 A | 7/1997 | Okada | |
| 5,648,849 A | 7/1997 | Canteloup | |
| 5,658,418 A | 8/1997 | Coronel | |
| 5,665,915 A | 9/1997 | Kobayashi | |
| 5,666,706 A | 9/1997 | Tomita et al. | |
| 5,668,057 A | 9/1997 | Eda et al. | |
| 5,728,936 A | 3/1998 | Lutz | |
| 5,783,749 A | 7/1998 | Lee et al. | |
| 5,894,090 A | 4/1999 | Tang et al. | |
| 5,905,202 A | 5/1999 | Kubena et al. | |
| 5,920,012 A | 7/1999 | Pinson | |
| 5,928,532 A | 7/1999 | Koshimizu | |
| 5,942,445 A | 8/1999 | Kato et al. | |
| 5,959,206 A | 9/1999 | Ryrko | |
| 5,959,207 A | 9/1999 | Letrondo | |
| 5,981,392 A | 11/1999 | Oishi | |
| 5,987,985 A | 11/1999 | Okada | |
| 6,009,751 A | 1/2000 | Ljung | |
| 6,044,705 A | 4/2000 | Neukermans | |
| 6,049,702 A | 4/2000 | Tham et al. | |
| 6,081,334 A | 6/2000 | Grimbergen | |
| 6,089,088 A | 7/2000 | Charvet | |
| 6,094,985 A | 8/2000 | Kapels et al. | |
| 6,114,801 A | 9/2000 | Tanaka et al. | |
| 6,121,940 A | 9/2000 | Skahill | |
| 6,145,380 A | 11/2000 | MacGugan | |
| 6,151,964 A | 11/2000 | Nakajima | |
| 6,155,115 A | 12/2000 | Ljung | |
| 6,164,134 A | 12/2000 | Cargille | |
| 6,182,352 B1 | 2/2001 | Deschenes | |
| 6,196,059 B1 | 3/2001 | Koesslinger | |
| 6,204,737 B1 | 3/2001 | Ella | |
| 6,207,008 B1 | 3/2001 | Kijima | |
| 6,236,145 B1 | 5/2001 | Biernacki | |
| 6,250,157 B1 | 6/2001 | Touge | |
| 6,263,552 B1 | 7/2001 | Takeuchi | |
| 6,282,958 B1 | 9/2001 | Fell et al. | |
| 6,289,733 B1 | 9/2001 | Challoner | |
| 6,297,064 B1 | 10/2001 | Koshimizu | |
| 6,349,597 B1 | 2/2002 | Folkmer | |
| 6,367,326 B1 | 4/2002 | Okada | |
| 6,367,786 B1 | 4/2002 | Gutierrez | |
| 6,413,682 B1 | 7/2002 | Shibano | |
| 6,417,925 B1 | 7/2002 | Naya | |
| 6,424,418 B2 | 7/2002 | Kawabata | |
| 6,426,296 B1 | 7/2002 | Okojie | |
| 6,429,652 B1 * | 8/2002 | Allen | G01C 17/28 324/259 |
| 6,432,824 B2 | 8/2002 | Yanagisawa | |
| 6,476,771 B1 | 11/2002 | McKinzie | |
| 6,481,284 B2 | 11/2002 | Geen et al. | |
| 6,481,285 B1 | 11/2002 | Shkel et al. | |
| 6,492,195 B2 | 12/2002 | Nakanishi | |
| 6,509,875 B1 | 1/2003 | Nair | |
| 6,513,380 B2 | 2/2003 | Reeds et al. | |
| 6,514,767 B1 | 2/2003 | Natan | |
| 6,515,278 B2 | 2/2003 | Wine et al. | |
| 6,518,930 B2 | 2/2003 | Itoh | |
| 6,571,629 B1 | 6/2003 | Kipp | |
| 6,584,845 B1 | 7/2003 | Gutierrez | |
| 6,614,529 B1 | 9/2003 | Tang | |
| 6,621,158 B2 | 9/2003 | Martin et al. | |
| 6,627,067 B1 | 9/2003 | Branton | |
| 6,628,177 B2 | 9/2003 | Clark et al. | |
| 6,629,460 B2 | 10/2003 | Challoner | |
| 6,651,027 B2 | 11/2003 | McCall | |
| 6,686,807 B1 | 2/2004 | Giousouf | |
| 6,710,681 B2 | 3/2004 | Figueredo | |
| 6,713,938 B2 | 3/2004 | Nguyen | |
| 6,715,352 B2 | 4/2004 | Tracy | |
| 6,744,335 B2 | 6/2004 | Ryhanen | |
| 6,750,728 B2 | 6/2004 | Takahashi | |
| 6,756,304 B1 | 6/2004 | Robert | |
| 6,768,396 B2 | 7/2004 | Klee et al. | |
| 6,796,179 B2 | 9/2004 | Bae et al. | |
| 6,806,557 B2 | 10/2004 | Ding | |
| 6,815,228 B2 | 11/2004 | Usui et al. | |
| 6,856,217 B1 | 2/2005 | Clark et al. | |
| 6,862,398 B2 | 3/2005 | Elkind et al. | |
| 6,883,374 B2 | 4/2005 | Fell et al. | |
| 6,909,221 B2 | 6/2005 | Ayazi et al. | |
| 6,915,215 B2 | 7/2005 | M'Closkey | |
| 6,933,164 B2 | 8/2005 | Kubena | |
| 6,943,484 B2 | 9/2005 | Clark et al. | |
| 6,944,931 B2 | 9/2005 | Shcheglov | |
| 6,954,020 B2 | 10/2005 | Ma et al. | |
| 6,985,051 B2 | 1/2006 | Nguyen et al. | |
| 7,040,163 B2 | 5/2006 | Shcheglov | |
| 7,042,419 B2 | 5/2006 | Werner | |
| 7,057,331 B2 | 6/2006 | Shimodaira | |
| 7,118,657 B2 | 10/2006 | Golovchenko | |
| 7,152,290 B2 | 12/2006 | Junhua et al. | |
| 7,168,318 B2 | 1/2007 | Challoner | |
| 7,211,933 B2 | 5/2007 | Kawakubo | |
| 7,224,245 B2 | 5/2007 | Song et al. | |
| 7,232,700 B1 | 6/2007 | Kubena | |
| 7,234,214 B2 | 6/2007 | Xu | |
| 7,237,315 B2 | 7/2007 | Kubena | |
| 7,295,088 B2 | 11/2007 | Nguyen | |
| 7,298,067 B1 | 11/2007 | Kosinski | |
| 7,317,354 B2 | 1/2008 | Lee | |
| 7,347,095 B2 | 3/2008 | Shcheglov | |
| 7,401,397 B2 | 7/2008 | Shcheglov | |
| 7,409,851 B2 | 8/2008 | Ilic et al. | |
| 7,446,461 B2 | 11/2008 | Watanabe | |
| 7,446,628 B2 | 11/2008 | Morris, III | |
| 7,459,099 B2 | 12/2008 | Kubena et al. | |
| 7,459,992 B2 | 12/2008 | Matsuda | |
| 7,479,846 B2 | 1/2009 | Inoue et al. | |
| 7,490,390 B2 | 2/2009 | Kawakubo | |
| 7,493,814 B2 | 2/2009 | Whelan et al. | |
| 7,543,496 B2 | 6/2009 | Ayazi | |
| 7,551,054 B2 | 6/2009 | Mizuno et al. | |
| 7,555,824 B2 | 7/2009 | Chang | |
| 7,555,938 B2 | 7/2009 | Bargatin et al. | |
| 7,557,493 B2 | 7/2009 | Fujimoto | |
| 7,559,130 B2 | 7/2009 | Kubena et al. | |
| 7,564,177 B2 | 7/2009 | Yoshimatsu | |
| 7,579,748 B2 | 8/2009 | Kuroda | |
| 7,579,926 B2 | 8/2009 | Jhung | |
| 7,581,443 B2 | 9/2009 | Kubena | |
| 7,619,568 B2 | 11/2009 | Gillette | |
| 7,624,494 B2 | 12/2009 | Challoner | |
| 7,647,688 B1 | 1/2010 | Chang | |
| 7,663,196 B2 | 2/2010 | Liu et al. | |
| 7,671,427 B2 | 3/2010 | Kim et al. | |
| 7,675,224 B2 | 3/2010 | Tanaya | |
| 7,690,095 B2 | 4/2010 | Takahashi | |
| 7,750,535 B2 | 7/2010 | Kubena | |
| 7,757,393 B2 | 7/2010 | Ayazi et al. | |
| 7,791,431 B2 | 9/2010 | Han | |
| 7,791,432 B2 | 9/2010 | Piazza et al. | |
| 7,793,541 B2 | 9/2010 | Challoner | |
| 7,802,356 B1 | 9/2010 | Chang | |
| 7,830,074 B2 | 11/2010 | Kubena et al. | |

(56) References Cited

U.S. PATENT DOCUMENTS

| | | | |
|---|---|---|---|
| 7,836,765 | B2 | 11/2010 | Challoner |
| 7,851,971 | B2 | 12/2010 | Chang |
| 7,872,548 | B2 | 1/2011 | Nishihara |
| 7,884,930 | B2 | 2/2011 | Kirby |
| 7,895,892 | B2 | 3/2011 | Aigner |
| 7,958,781 | B2 | 6/2011 | Fell |
| 7,987,714 | B2 | 8/2011 | DeNatale |
| 7,994,877 | B1 | 8/2011 | Kubena |
| 8,138,016 | B2 | 3/2012 | Chang |
| 8,151,640 | B1 | 4/2012 | Kubena |
| 8,176,607 | B1 | 5/2012 | Kubena |
| 8,205,495 | B2 | 6/2012 | Challoner |
| 8,322,028 | B2 | 12/2012 | Ge et al. |
| 8,381,590 | B2 | 2/2013 | Ikeda et al. |
| 8,393,212 | B2 | 3/2013 | Ge et al. |
| 8,402,824 | B1 | 3/2013 | Kubena |
| 8,471,776 | B2 | 6/2013 | Das |
| 8,522,612 | B1 | 9/2013 | Kubena |
| 8,569,937 | B1 | 10/2013 | Kubena |
| 8,593,037 | B1 | 11/2013 | Kubena |
| 8,765,615 | B1 | 7/2014 | Chang |
| 8,766,745 | B1 | 7/2014 | Kubena |
| 8,769,802 | B1 | 7/2014 | Chang |
| 8,782,876 | B1 | 7/2014 | Kubena |
| 8,912,711 | B1 | 12/2014 | Chang et al. |
| 8,933,759 | B1 | 1/2015 | Kubena et al. |
| 8,957,831 | B1 | 2/2015 | Gregoire |
| 8,959,831 | B2 | 2/2015 | Smith |
| 8,976,077 | B2 | 3/2015 | Colburn |
| 9,038,459 | B1 | 5/2015 | Kubena |
| 9,046,541 | B1 | 6/2015 | Kubena |
| 9,061,886 | B1 | 6/2015 | Nguyen |
| 9,250,074 | B1 | 2/2016 | Kubena |
| 9,425,769 | B1 | 8/2016 | White |
| 2001/0050641 | A1 | 12/2001 | Itoh |
| 2002/0066317 | A1 | 6/2002 | Lin |
| 2002/0072246 | A1 | 6/2002 | Goo et al. |
| 2002/0074947 | A1 | 6/2002 | Tsukamoto |
| 2002/0107658 | A1 | 8/2002 | McCall |
| 2002/0185611 | A1 | 12/2002 | Menapace |
| 2003/0003608 | A1 | 1/2003 | Arikado |
| 2003/0010123 | A1 | 1/2003 | Malvern |
| 2003/0020655 | A1 | 1/2003 | McKinzie |
| 2003/0029238 | A1 | 2/2003 | Challoner |
| 2003/0112186 | A1 | 6/2003 | Sanchez |
| 2003/0196490 | A1 | 10/2003 | Cardarelli |
| 2003/0205948 | A1 | 11/2003 | Lin et al. |
| 2004/0055380 | A1 | 3/2004 | Shcheglov |
| 2004/0055381 | A1 | 3/2004 | Shcheglov |
| 2004/0056814 | A1 | 3/2004 | Park |
| 2004/0065864 | A1 | 4/2004 | Vogt et al. |
| 2004/0189311 | A1 | 9/2004 | Glezer |
| 2004/0211052 | A1 | 10/2004 | Kubena et al. |
| 2004/0263420 | A1 | 12/2004 | Werner |
| 2005/0024165 | A1 | 2/2005 | Hsu |
| 2005/0034822 | A1 | 2/2005 | Kim et al. |
| 2005/0056917 | A1 | 3/2005 | Kwon |
| 2005/0062368 | A1 | 3/2005 | Hirasawa |
| 2005/0093659 | A1 | 5/2005 | Larson et al. |
| 2005/0146475 | A1 | 7/2005 | Bettner |
| 2005/0156309 | A1 | 7/2005 | Fujii |
| 2005/0172714 | A1 | 8/2005 | Challoner |
| 2005/0260792 | A1 | 11/2005 | Patel |
| 2005/0274183 | A1 | 12/2005 | Shcheglov |
| 2006/0016065 | A1 | 1/2006 | Nagaura |
| 2006/0017651 | A1 | 1/2006 | Werner |
| 2006/0022556 | A1 | 2/2006 | Bail et al. |
| 2006/0055479 | A1 | 3/2006 | Okazaki |
| 2006/0066419 | A1 | 3/2006 | Iwaki |
| 2006/0162146 | A1 | 7/2006 | Shcheglov |
| 2006/0197619 | A1 | 9/2006 | Oishi et al. |
| 2006/0213266 | A1 | 9/2006 | French |
| 2006/0252906 | A1 | 11/2006 | Godschalx |
| 2006/0255691 | A1 | 11/2006 | Kuroda |
| 2007/0017287 | A1 | 1/2007 | Kubena |
| 2007/0034005 | A1 | 2/2007 | Acar |
| 2007/0069605 | A1 | 3/2007 | Klaasse et al. |
| 2007/0084042 | A1 | 4/2007 | Challoner |
| 2007/0205839 | A1 | 9/2007 | Kubena et al. |
| 2007/0220971 | A1 | 9/2007 | Ayazi |
| 2007/0240508 | A1 | 10/2007 | Watson |
| 2008/0034575 | A1 | 2/2008 | Chang et al. |
| 2008/0074661 | A1 | 3/2008 | Zhang et al. |
| 2008/0094300 | A1 | 4/2008 | Lee |
| 2008/0096313 | A1 | 4/2008 | Patel |
| 2008/0100176 | A1 | 5/2008 | Haskell |
| 2008/0148846 | A1 | 6/2008 | Whelan |
| 2008/0295622 | A1 | 12/2008 | Challoner |
| 2009/0095077 | A1 | 4/2009 | DeNatale |
| 2009/0140356 | A1 | 6/2009 | Yazdi |
| 2009/0146527 | A1 | 6/2009 | Lee et al. |
| 2009/0189294 | A1 | 7/2009 | Chang |
| 2010/0020311 | A1 | 1/2010 | Kirby |
| 2010/0024560 | A1 | 2/2010 | Shcheglov |
| 2010/0039111 | A1 | 2/2010 | Luekeke |
| 2010/0039343 | A1 | 2/2010 | Uno |
| 2010/0148803 | A1 | 6/2010 | Ohnishi |
| 2010/0231470 | A1 | 9/2010 | Lee |
| 2010/0238085 | A1 | 9/2010 | Fuh |
| 2010/0251817 | A1 | 10/2010 | Ge et al. |
| 2010/0251818 | A1 | 10/2010 | Ge et al. |
| 2011/0090128 | A1 | 4/2011 | Sulima |
| 2011/0107838 | A1 | 5/2011 | Suijlen |
| 2011/0115584 | A1 | 5/2011 | Kiji |
| 2012/0000288 | A1 | 1/2012 | Matsuura |
| 2012/0025333 | A1 | 2/2012 | Yoshida |
| 2012/0212109 | A1 | 8/2012 | Yamazaki et al. |
| 2012/0256811 | A1 | 10/2012 | Colburn |
| 2012/0266682 | A1 | 10/2012 | Torashima |
| 2012/0287006 | A1 | 11/2012 | Lenormand |
| 2012/0306321 | A1* | 12/2012 | Ishii ..................... H03H 9/0542 310/348 |
| 2013/0009720 | A1 | 1/2013 | White |
| 2013/0268250 | A1 | 10/2013 | Werner |
| 2013/0313947 | A1* | 11/2013 | Chen ...................... H03H 3/007 310/348 |
| 2014/0049256 | A1 | 2/2014 | Smith |
| 2015/0188030 | A1 | 7/2015 | Andosca |
| 2015/0244079 | A1 | 8/2015 | White |
| 2015/0263432 | A1 | 9/2015 | White |
| 2016/0079884 | A1 | 3/2016 | Lange |

FOREIGN PATENT DOCUMENTS

| | | |
|---|---|---|
| EP | 0 461 761 | 12/1991 |
| EP | 0 531 985 | 3/1993 |
| EP | 1055908 | 11/2000 |
| EP | 0 971 208 | 12/2000 |
| JP | 57-091017 | 6/1982 |
| JP | 401129517 | 5/1989 |
| JP | 04322507 | 11/1992 |
| JP | 5286142 | 11/1993 |
| JP | 06232678 | 8/1994 |
| JP | 6-318533 | 11/1994 |
| JP | 08330878 | 12/1996 |
| JP | 9-247025 | 9/1997 |
| JP | 2003-318685 | 11/2003 |
| JP | 2005-180921 | 7/2005 |
| JP | 2006-352487 | 12/2006 |
| KR | 10-2001-0110428 | 12/2001 |
| WO | 84-00082 | 1/1984 |
| WO | 96/38710 | 12/1996 |
| WO | 98/15799 | 4/1998 |
| WO | 00/68640 | 11/2000 |
| WO | 01/44823 | 6/2001 |
| WO | 01/74708 | 10/2001 |
| WO | 02/12873 | 2/2002 |
| WO | 2004/013933 | 2/2004 |
| WO | 2005/121769 | 12/2005 |

(56) References Cited

FOREIGN PATENT DOCUMENTS

WO 2006/010206 2/2006
WO 2006/103439 10/2006

OTHER PUBLICATIONS

"Development of Miniature Magnetometers" Dennis K. Wickenden, Thomas J. Kistenmacher, Robert Osiander, Scott A. Ecelberger, R. Ben Givens, and John C. Murphy, *Johns Hopkins APL Technical Digest*, vol. 18, No. 2 (1997) pp. 271-276.
"A Resonant Micromachined Magnetic Field Sensor", Behraad Bahreyni, and Cyrus Shafai, IEEE Sensors Journal, vol. 7, No. 9, Sep. 2007, pp. 1326-1334.
"A resonant magnetic field microsensor with high quality factor at atmospheric pressure," A L Herrera-May, P J Garcia-Ramirez, L A Aguilera-Cortes, J Martinez-Castillo, A Sauceda-Carvajal, L Garcia-Gonzalez, and E Figueras-Costa, *J. Micromech. Microeng.* 19 (2009) 015016 (pp. 1-11).
"Low Power 3-axis Lorentz Force Navigation Magnetometer," M.J. Thompson, M. Li, and D.A. Horsley, MEMS 2011, Cancun, Mexico, January pp. 593-596, 2011.
U.S. Appl. No. 13/910,039, filed Jun. 2013, Gregoire et al.
"Micromechanical magnetometer using an all-silicon nonlinear torsional resonator," D. Antonio, M. I. Dolz, and H. Pastoriza, *Applied Physics Letters* 95, pp. 133505-1-133505-3, 2009.
R. Sunier, T. Vancura, Y. Li, K.-U. Kirstein, H. Baltes, and O. Brand, "Resonant Magnetic Field Sensor With Frequency Output," J. MEMS, vol. 15, No. 5, pp. 1098-1107, Oct. 2006.
Zhang, Xuehui, Huaxiang Wang, Shenghua Chen, and Yan Zhang. "FPGA-Based Multi-Frequency Excitation and Modulation Technology in EIT System" in *2010 3rd International Conference on Biomedical Engineering and Informatics* (*BMEI*), pp. 907-911, 2010. doi:10.1109/BMEI.
Younis, Mohammad I. "Multi-Mode Excitation of a Clamped—clamped Microbeam Resonator." *Nonlinear Dynamics* 80, No. 3 (May 2015): pp. 1531-1541. doi:10.1007/s11071-015-1960-1.
U.S. Appl. No. 61/655,670, filed Jun. 2012, Gregoire et al.
U.S. Appl. No. 15/083,190, filed Mar. 2016, Perahia et al.
U.S. Appl. No. 14/628,076, filed Feb. 2015, White et al.
U.S. Appl. No. 14/628,182, filed Feb. 2015, Nguyen et al.
U.S. Appl. No. 61/943,213, filed Feb. 2014, Nguyen et al.
U.S. Appl. No. 14/997,160, filed Jan. 2016, Nguyen et al.
U.S. Appl. No. 14/997,203, filed Jan. 2016, Sorenson et al.
From U.S. Appl. No. 14/997,160 (unpublished, non publication requested filed), Office Action dated Sep. 14, 2017.
Braun, Teresa M., Satellite Communications Payload and System, Sep. 2012 (cited in U.S. Appl. No. 13/910,039, filed Sep. 12, 2017), 3 pages.
Dutta et al. "Unidirectional AMC Reflector Backed L-band Annular Slot Antenna." IEEE International Conference on Microwaves, Communications, Antennas and Electronic Systems. Nov. 2-4, 2015, 5 pages.
Kamardin et al. "Printed Dipole with Slot EBG Structures with Artificial Magnetic Conductor and Band-Notched Behaviors." IEEE International RF and Microwave Conference, Dec. 12-14, 2011. pp. 217-222.
U.S. Appl. No. 14/997,160, filed Jan. 15, 2016, Nguyen.
EPO extended search report from European Patent Application No. 14882944.3 dated Sep. 28, 2017.
Gregoire, et al., "A Coaxial TEM Cell for Direct Measurement of UHF Artificial Magnetic Conductors [AMTACorner]", IEEE Antennas and Propagation Magazine, IEEE Service Center, Piscataway, NJ, US, vol. 54, No. 2, Apr. 1, 2012 (Apr. 1, 2012), pp. 251-259, XP011480257.
U.S. Appl. No. 12/026,486, filed Feb. 5, 2008, Kubena.
U.S. Appl. No. 12/179,579, filed Jul. 24, 2008, Kubena.
U.S. Appl. No. 13/363,174, filed Jan. 31, 2012, Kubena.
U.S. Appl. No. 14/547,057, filed Nov. 18, 2014, Kubena.
U.S. Appl. No. 14/680,902, filed Apr. 7, 2015, Kubena.
From U.S. Appl. No. 14/997,160 (unpublished; non-publication request filed), Office Action dated Apr. 3, 2017.
From U.S. Appl. No. 14/997,203 (unpublished; non-publication request filed), Office Action dated Mar. 2, 2017.
Aaltonen, T. et al., "ALD of Rhodium thin films from Rh (acac) 3 and Oxygen" Electrochemical and Solid State Letters, 8, C99-101 ( 2005).
Abe, T., et al., "One-chip Multichannel Quartz Crystal Microbalance (QCM) Fabricated by Deep RIE," Sensors and Actuators, 82 (2000), pp. 139-143.
Barbour et al., "Micromechanical Silicon Instrument and Systems Development at Draper Laboratory," AIAA Guidance Navigation and Control Conference, 1996, Paper No. 96-3709 (20 pages).
Burdess et al., "The Theory of a Piezoelectric Disc Gyroscope", Jul. 1986, IEEE Transactions and Aerospace abd Electronic Systems, vol. AES 22, No. 4; p. 410-418.
Cleland, A.N. et al., "Fabrication of High Frequency Nanometer Scale Mechanical Resonators From Bulk Si Crystals," Applied Physics Letters, Oct. 28, 1996, pp. 2653-2655.
Evoy, S., et al. "Temperature-dependent Internal Friction in Silicon Nanoelectromechanical Systems," Applied Physics Letters, vol. 77, No. 15, Oct. 9, 2000, pp. 2397-2399.
Friedt, J-M., et al., "Introduction to the quartz tuning fork" American Journal of Physics 75, 415 (2007), pp. 415-422.
Fujita et al., "Disk-shaped bulk micromachined gyroscope with vacuum sealing," Sensors and Actuators 82, May 2000, pp. 198-204.
Greer, J.A., et al., "Properties of SAW resonators fabricated on quartz substrates of various qualities" Ultrasonics Symposium, 1994 IEEE, vol. 1, Nov. 1-4, 1994, pp. 31-36.
Johnson et al., "Surface Micromachined Angular Rate Sensor," 1995 SAE Conference, Paper No. 950538, pp. 77-83.
Lin, J.W., et al., "A Robust High-Q Micromachined RF Inductor for RFIC Applications," IEEE Transactions on Electronic Devices, vol. 52, No. 7, pp. 1489-1496 (Jul. 2005).
Nguyen, Hung D., et al., "UHF Piezoelectric Quartz MEMS Magnetometers Based on Acoustic Coupling of Flexural and Thickness Shear Modes," MEMS 2015, Estoril, Portugal, Jan. 18-22, 2015, pp. 944-947.
Park, K.J. et al., "Selective area atomic layer deposition of rhodium and effective work function characterization in capacitor structures," Applied Physics Letters 89, 043111 (2006), 3 pages.
Putty et al., "A Micromachined Vibrating Ring Gyroscope," Solid State Sensor and Actuator Workshop, Transducer Research Foundation, Hilton Head, South Carolina, 1994, pp. 213-220.
Sirbuly, Donald J. et al., Multifunctional Nanowire Evanescent Wave Optical Sensors, Advanced Materials, 2007 (published online: Dec. 5, 2006), 19, pp. 61-66.
Skulski et al., "Planar resonator sensor for moisture measurements", Microwaves and Radar, 1998, MIKON '98, 12th International Conf., vol. 3, May 20-22, 1998, pp. 692-695.
Tang et al., "A Packaged Silicon MEMS Vibratory Gyroscope for Microspacecraft," Proceedings IEEE, 10th Annual Int. Workshop on MEMS, Japan, 1997, pp. 500-505.
Tang et al., "Silicon Bulk Micromachined Vibratory Gyroscope," Jet Propulsion Lab, Jun. 2, 1996 (6 pages).
White, Lan M., et al., Increasing the Enhancement of SERS with Dielectric Microsphere Resonators, Spectroscopy-Eugene, Apr. 2006 (5 pages).
Wright, et al., "The HRG Applied to a Satellite Attitude Reference System," Guidance and Control, AASAAS, 1994, 86: pp. 55-67.
Yan, Fei, et al., "Surface-enhanced Raman scattering (SERS) detection for chemical and biological agents," IEEE Sensors Journal, vol. 5, No. 4, Aug. 2005 (7 pages).
From U.S. Appl. No. 14/997,160 (unpublished; non publication request filed), office action dated Feb. 5, 2018.
From U.S. Appl. No. 14/997,203 (unpublished; non publication request filed), office action dated Feb. 9, 2018.

* cited by examiner

Single die package with multi-axis magnetometer

Assembly of three discrete dies of single-axis magnetometer (torsional mode)

(extensional/compression mode)

PIEZOELECTRIC MAGNETOMETER CAPABLE OF SENSING A MAGNETIC FIELD IN MULTIPLE VECTORS

CROSS REFERENCE TO RELATED APPLICATIONS AND PATENTS

This Application claims the benefit of U.S. Provisional Patent Application Ser. No. 62/104,227 filed Jan. 16, 2015 and entitled "Quartz Micro-Magnetometer with Trapezoidal Quartz Resonant Plate for Enhanced Magnetic Sensitivity" the disclosure of which is hereby incorporated herein by reference.

This application is also a continuation in part of U.S. patent application Ser. No. 14/628,182 filed Feb. 20, 2015 and entitled "A Micro-Scale Piezoelectric Resonating Magnetometer", the disclosure of which is hereby incorporated herein by reference.

This Application is related to U.S. Provisional Patent Application Ser. No. 61/943,213 filed 21 Feb. 2014 and entitled "A Micro-Scale Piezoelectric Resonating Magnetometer", the disclosure of which is hereby incorporated herein by reference.

This Application is also related to U.S. patent application Ser. No. 14/997,160 filed on the same date as this application and entitled "Quartz Magnetometer having a Quartz Resonant Plate with a Broaden Distal End for Enhanced Magnetic Sensitivity" and to U.S. patent application Ser. No. 14/997,203 filed on the same date as this application and entitled "FM Demodulation System for Quartz MEMS Magnetometer". The disclosure of each of these two applications is hereby incorporated herein by reference.

The technology disclosed in this application is related to and preferably employs the technology of U.S. Pat. No. 7,830,074 entitled "Integrated quartz oscillator on an active electronic substrate", the disclosure of which is hereby incorporated herein by reference.

STATEMENT REGARDING FEDERALLY SPONSORED RESEARCH OR DEVELOPMENT

None

TECHNICAL FIELD

This invention relates to the operation of a quartz micro-magnetometer which is capable of sensing multiple vector components of a magnetic field impinging the quartz micro-magnetometer. This multi-axis sensor simplifies the overall device packaging and system design by reducing the number of required sensors to detect the three vector components needed to compile the total magnetic field. The multi-axis quartz magnetometer exploits two or more mechanical drive modes that are excited by the Lorentz force. The drive mode vibration frequency couples up to the thickness-shear frequency of the sense mode in the form of frequency modulated sidebands whose frequency offset from the carrier signal corresponds uniquely to the frequency of the specific mechanical mode. Measuring the offset frequency identifies the exact drive mode and hence vector component of the B-field and the amplitude of the sideband correlates back to the magnitude of the vector component.

BACKGROUND

Standard vector magnetometers detecting the strength and direction of the magnetic field are typically limited to sensing a single vector component of the sensed magnetic field. Tri-axial detection requires a configuration of three discrete single-axis sensors packaged discretely and aligned precisely along the orthogonal x, y, and z axes to accurately reconstruct the total magnetic field. See FIG. 1*a*. A three sensor chip configuration is more susceptible to environmental gradient effects (i.e. thermal, mechanical, and magnetic) due to the large distances between sensors than would be a single chip sensor such as that proposed herein and depicted by FIG. 1*b*. Die-to-die placement of the three discrete sensors also incur significant errors from the misalignment of the sensors along the orthogonal axes. During operation, the sensors' orientation can also drift due to vibration and thermal effects adding cross-axis coupling errors.

A dual-axis or tri-axial sensor like the proposed quartz magnetometer disclosed herein, can replace the previously described three-sensor configuration with a single die package where multi-vector field detection can be performed at the same location. The smaller volume coming from a single die ensures more consistent readouts as the environmental effects within a die are more uniform. Additionally, alignment accuracy is no longer dependent on die-to-die placement but on microfabrication processes which provides far better alignment precision (sub-micron) and accuracy. Alignment drifts from packaging is no longer a concern when the multi-axis detection schemes are implemented on a single device.

The prior art includes: "Development of Miniature Magnetometers" Dennis K. Wickenden, Thomas J. Kistenmacher, Robert Osiander, Scott A. Ecelberger, R. Ben Givens, and John C. Murphy, *Johns Hopkins APL Technical Digest*, Vol. 18, Num. 2 (1997) 271.

"A Resonant Micromachined Magnetic Field Sensor," Behraad Bahreyni, and Cyrus Shafai, *IEEE Sensors Journal*, VOL. 7, NO. 9, September 2007

"A resonant magnetic field microsensor with high quality factor at atmospheric pressure," A L Herrera-May, P J Garcia-Ramirez, L A Aguilera-Cortes, J Martinez-Castillo, A Sauceda-Carvajal, L Garcia-Gonzalez, and E Figueras-Costa, *J. Micromech. Microeng.* 19 (2009) 015016 (11 pp)

"Low Power 3-axis Lorentz Force Navigation Magnetometer," M. J. Thompson, M. Li, and D. A. Horsley, MEMS 2011, Cancun, Mexico, Jan. 23-27, 2011.

"Micromechanical magnetometer using an all-silicon nonlinear torsional resonator," D. Antonio, M. I. Dolz, and H. Pastoriza, *Applied Physics Letters* 95, 133505 2009.

BRIEF DESCRIPTION OF THE INVENTION

In one aspect the present invention provides a magnetometer comprising a resonating structure which is naturally resonant in at least two but preferably three different resonant modes, a resonant frequency of the two or three modes being sufficiently separated to allow of detection of same, the resonating structure having two sense electrodes disposed on opposing major surfaces of the resonating structure and having a conductive path formed as a loop, the loop being disposed near or at edges of the resonating structure and the two sense electrodes being formed inwardly of the edges of the resonating structure and also inwardly of said loop.

In another aspect the present invention provides a resonating structure formed of a beam or plate of piezoelectric material, the beam or plate of piezoelectric material being naturally resonant in at least two resonant modes, the resonating structure having two sense electrodes disposed on opposing major surfaces of the resonating structure and having a conductive path formed as a loop disposed on said resonating structure, the loop being disposed near or at edges of the resonating structure and the two sense electrodes being formed inwardly of the loop at or near a point of maximum shear mode strain.

DETAILED DESCRIPTION

Figure 2:
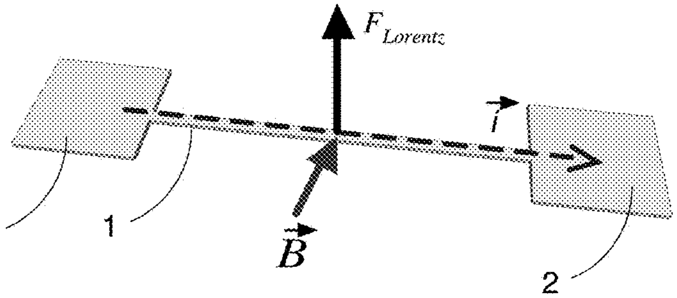
FIG. 2 depicts the basic design of a Lorentz-based resonant magnetometer with the magnetic Lorentz force deflecting the doubly-clamped mechanical beam.

FIG. 2 shows the basic principle behind an example of a Lorentz-force magnetometer. In the depicted configuration, the magnetometer consists of a suspended doubly-clamped beam 1 that is anchored at both ends 2. An alternative design would comprise a singly-clamped cantilever beam (in FIG. 2*a* and elsewhere) anchored at one end instead of both ends. Singly-clamped magnetometer are also known in the prior art. See R. Sunier, T. Vancura, Y. Li, K.-U. Kirstein, H. Baltes, and O. Brand, "Resonant Magnetic Field Sensor With Frequency Output," J. MEMS, vol. 15, no. 5, pp. 1098-1107, October 2006.

An external magnetic field $\vec{B}$ interacts with the current $\vec{i}$ that flows along the perimeter of the beam. The coupling between the $\vec{B}$ field and the current $\vec{i}$ generates a Lorentz magnetic force $\vec{F}_{Lorentz}$ directed perpendicular to both the magnetic field and current flow as described by Eqn. 1 below where $\vec{i}$ is the current, L is the length of the current line, and $\vec{B}$ is the magnetic field strength:

$$F_{Lorentz}=\vec{i}L\times\vec{B} \qquad \text{Eqn. (1)}$$

An increase in either the drive current or current length generates larger forces and greater deflection for increased sensitivity and a lower detectable field limit. In the prior art, the amount of beam deflection that occurs as a result of the Lorentz force is normally measured capacitively or optically by an appropriate sensor to ascertain the strength of the magnetic field causing the beam 1 to deflect.

Further improvement in sensitivity can be achieved when a sensor is driven into resonance by an AC current applied to a loop 12 (see FIGS. 2*a* and 2*b*), the applied AC having an actuation frequency which desirably matches the beam's flexure mode frequency. At resonance, the beam deflection $d_{AC}$ (deflection $d_{AC}$ is the deflection measured at the tip (free end) of a cantilever beam—when the beam is vibrating under flexure mode resonance (the beam vibrating up and down normal to its major surface at resonance)—this deflection can be much larger than the DC deflection $d_{DC}$ of the beam (under an equal static force) and is a function (see Eqn. 2 below) of the actuation frequency f, the flexure mode frequency $f_{flexure}$ of the beam and the quality factor or Q of the beam. A beam with a higher Q tends to enhance the sensitivity of the resulting magnetometer proportionally compared to a beam with a relatively lower Q. A quartz beam should have higher intrinsic Q compared to a silicon beam, for example, and therefor a quartz beam would be preferred compared to a silicon beam in most applications.

$$d_{AC}(f) = \frac{d_{DC}}{\sqrt{\left(1-\frac{f^2}{f_{flexture}^2}\right)^2+\left(\frac{1}{Q}\frac{f}{f_{flexture}}\right)^2}} \rightarrow d_{AC}(f_{flexture}) = Qd_{DC} \qquad \text{Eqn. (2)}$$

where $d_{DC}$ is the static deflection of the beam, f is the drive frequency and $f_{flexure}$ is the mechanical resonant frequency of the beam.

Note should be made of the different orientation of the B field to be measured by the disclosed magnetometer compared to the orientation of the B field of the prior art device of FIG. 2.

As the drive frequency of the applied AC approaches the beam's flexure mode frequency, the AC deflection equation (Eqn. 2) reduces to the product of the DC deflection ($d_{DC}$) and the quality factor (Q). Vacuum packaging of the magnetometer increases the quality factor (Q) by allowing the magnetometer to operate with greater deflection at low pressure without viscous damping. As such, the disclosed magnetometer is preferably packaged so that it can operate in a vacuum environment and is preferably made using MEMS manufacturing techniques So, if one drives the beam's loop 12 with an AC signal whose drive frequency matches the frequency of the beam's natural mechanical resonance, then the deflection with AC drive will be the static deflection (from a DC drive signal) amplified by the Q of the beam. Ideally, the desired frequency match is perfect. But in real life, few things are perfect and hence the frequency of the AC drive current must at least be within the bandwidth of the flexure mode frequency (where its bandwidth is inversely proportional to the Q of the beam) for a match to occur. Additionally close-loop operation using a phase-locked loop (PLL) and a local oscillator can be implemented by actively tracking and locking the drive frequency to the flexure mode frequency to mitigate drifting.

The sensing mechanism of the quartz magnetometer relies on the induced bending strain on the quartz plate by an applied Lorentz force generated from the interaction between the magnetic field and the AC current loop 12 running along the edge of the quartz plate 10. The bending strain at the sense electrodes is then detected by a change in resonance of an acoustic mode in the quartz. In other words, the sensing mechanism is based on the acoustic coupling between two resonant modes where one mode is driven into mechanical vibration (i.e. flexure mode, torsional mode, or extensional mode, typically kHz frequencies) by the sinusoidal Lorentz force and a second higher frequency mode (typically UHF frequencies) detects the vibration in the form of a frequency shift. This frequency shift is represented as a frequency modulation (frequency offset equals to the mechanical vibration frequency) of the higher frequency mode whose sideband amplitude can then be correlated back to the magnetic field strength.

Figure 2A:
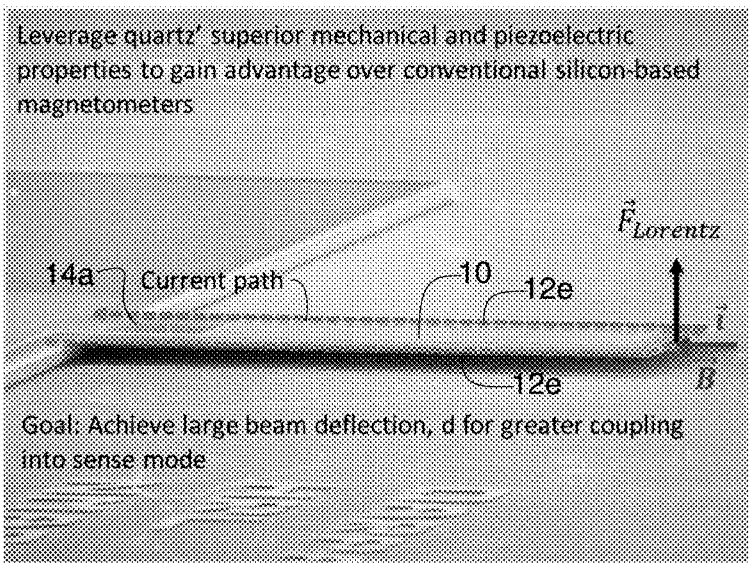
FIG. 2*a* is an image and FIGS. 2*b* and 2*c* are a schematic drawings of an embodiment UHF quartz cantilevered resonator of the present invention showing out-of-plane Lorentz force due to coupling between the B-field and the current flow, FIG. 2*b* being a perspective view while FIG. 2*c* being a side elevational view. This embodiment has a rectangular shaped quartz plate.
Figure 2B:
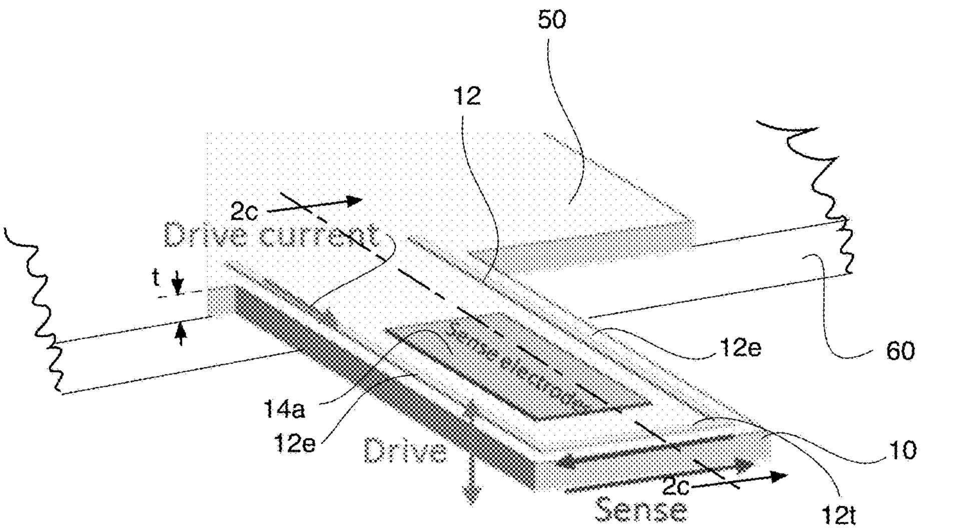
Figure 2C:
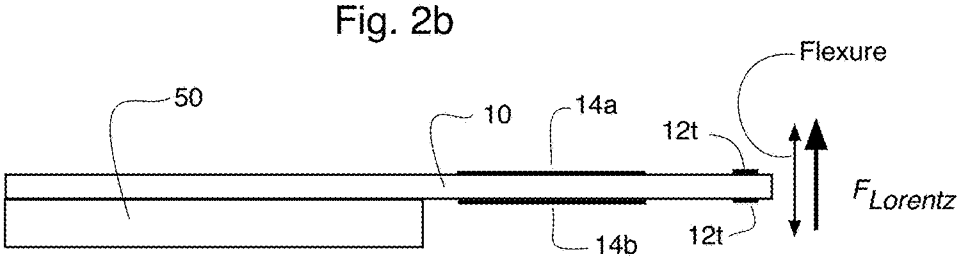

In the embodiment of FIGS. 2*a*-2*c*, the quartz plate is rectangularly shaped. The quartz resonator has a quartz cantilever 10 which is preferably fixed (thus clamped) at one end of same where it is preferably integrally connected to a wider quartz base 50 which in turn may be directly anchored to a substrate 60 which may be made of silicon for example. The fabrication of the quartz resonant magnetometer depicted in FIG. 2*a* preferably mirrors the apparatus and process that is described in the U.S. Pat. No. 7,830,074 noted above and entitle "Integrated quartz oscillator on an active electronic substrate," but with additional metal patterns disposed along the two parallel (in case of the rectangularly shaped quartz plate) side edges (see metal 12*e*) and along the tip (see metal 12*t*) of the quartz cantilever 10 thereby forming an electrically conductive loop 12 (preferably comprising two metal segments 12*e* and one metal segment 12*t*) for conducting the AC current loop when a appropriate current is applied to the electrically conductive loop 12.

Opposing sense electrodes 14*a* and 14*b* are formed, preferably of metal, on the quartz cantilever 10, one of which (sense electrode 14*a*) is depicted in FIG. 2*b* disposed on the upper surface of the quartz cantilever 10. There is another sense electrode 14*b*, opposing sense electrode 14*a*, disposed on the lower surface of the quartz cantilever 10 (see FIG. 2*c*). The two opposing sense electrodes 14*a* and 14*b* are preferably surrounded by the current loop formed by the electrically conductive loop 12 (which metal pattern 12 is not shown in FIG. 2*c* for ease of illustration). The current loop formed by the electrically conductive loop 12 is shown disposed on an upper surface of the quartz cantilever 10 in FIG. 2*b*. The current loop formed by the metal pattern 12 may be disposed only on the upper surface of the quartz cantilevered beam 10 or the current loop formed by the metal pattern 12 may be disposed on both the upper and lower surfaces of the quartz cantilever 10, with the two loops then being connected preferably in parallel with each other. If two loops 12 are formed, then of course there are four metallic segments 12*e* along the parallel edges of the quartz cantilever 10 and two metallic segments 12*t* along the tip of the quartz cantilever 10. Also, the current loop formed by the electrically conductive loop 12 may alternatively be formed only on the lower surface of the quartz cantilever 10 if desired.

The dimensions of the quartz beam 10 will vary as needed. The thickness (t) of beam 10 will affect the frequency of the sensing mode (thickness-shear). Currently, beams are being developed having a nominal thickness t (see FIG. 2*b*) of about 2-3 μm thick (which can be resonant at UHF frequencies), but such a thickness may not necessarily be optimum. The thickness shear resonant frequency depends on the quartz thickness. There is a tradeoff between sensitivity to B-field and sensitivity to unwanted mechanical vibration and ease of fabrication. A thicker quartz beam 10 will achieve VHF frequencies (and maybe even HF frequencies) and make the device immune to mechanical vibrations which is desirable, but a thicker quartz beam 10 is less sensitive to the Lorentz force.

Figure 2D:
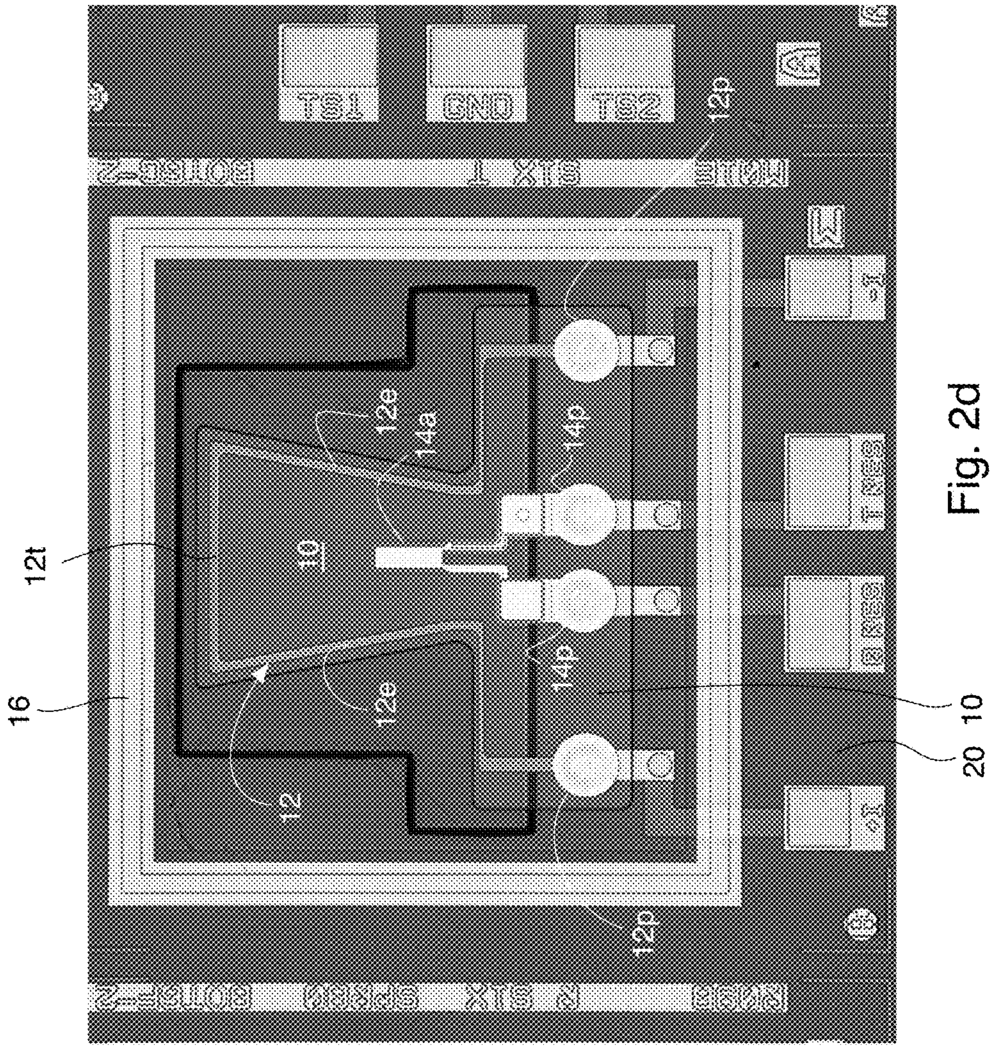
FIG. 2*d* is a Scanning Electron Microscope (SEM) image of another embodiment of a quartz cantilevered resonator of the present invention, this embodiment being characterized by a wedge shaped quartz plate as opposed to a rectangular quartz plate of the embodiment of FIGS. 2*a*-2*c*.

The length of the tip metallic segment 12*t* can be increased by making it longer to improve sensitivity if a wedge or trapezoidal shaped plate 10 is used as is depicted by the embodiment of FIG. 2*d* herein and in U.S. patent application Ser. No. 14/997,160 filed on the same date as this application and entitled "Quartz Magnetometer having a Quartz Resonant Plate with a Broaden Distal End for Enhanced Magnetic Sensitivity".

Figure 1C:
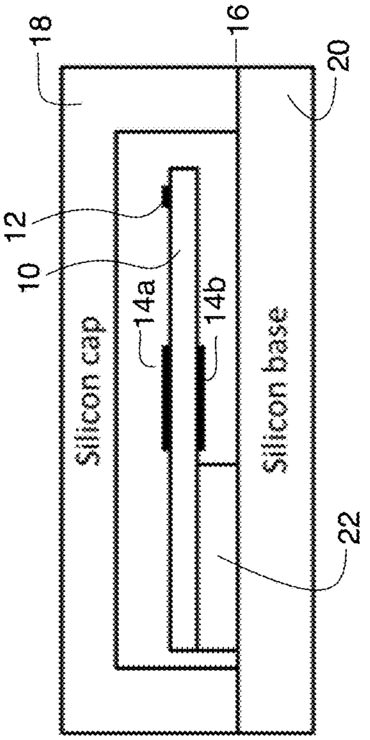
FIG. 1*c* is a side elevational view of the magnetometer or resonator mounted on a silicon substrate or base and under a cap or enclosure, the magnetometer or resonator being responsive to a magnetic field in two or preferably three orthogonal vectors.
Figure 1B:
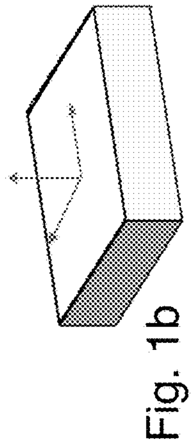
FIG. 1*b* depicts a single three axes magnetometer mounted in a single enclosure.
Figure 1A:
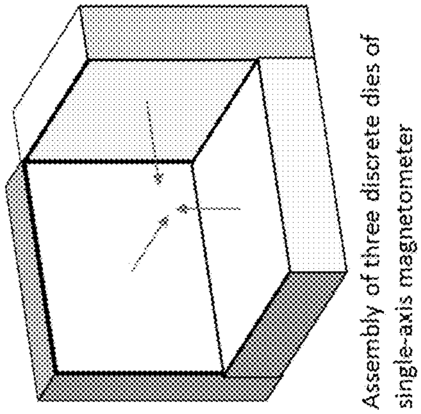
FIG. 1*a* depicts three single axis magnetometers, each of which is responsive to a single axis or coordinate direction of a magnetic field, arranged so that the axis of each points in a different direction so that the three single axis magnetometers function as a three axis magnetometer.

The resonator shown in FIG. 1*c* may be mounted on a semiconductor substrate 20 (such as silicon, for example) using a pedestal 22 to allow for flexure of the quartz beam 10 and a cap or enclosure 18 may be used to vacuum seal the resonator therein, the cap or enclosure 18 being preferably compression bonded to substrate 20 at a bonding pad 16 on substrate 20. The substrate 20 may have driver/sensor circuitry formed therein to connect to the electrodes 14*a* and 14*b* as well as to the loop conductor 12. The loop conductor 12 may be disposed on the top surface of the quartz beam 10 or on the bottom surface thereof one both the both the top and bottom surfaces there as depicted in FIG. 2*c*.

In FIG. 2*d*, the wedge shaped quartz plate 10 can be easily seen as well as the semiconductor substrate 20 upon which it is mounted. Connections to loop conductor 12 are brought out to the semiconductor substrate 20 at pads 12*p*. Connections to electrodes 14*a* and 14*b* are brought to the semiconductor substrate 20 at pads 14*p*. Quartz is transparent so conductors between sense electrodes 14*a* and 14*b* and their respective pads 12*p* can be seen. Also, the loop conductor could be on either the top or bottom surface (or both surfaces) of the quartz beam 10 in this view again due to the transparency of quartz.

Figures 3A, 3B, 3C:
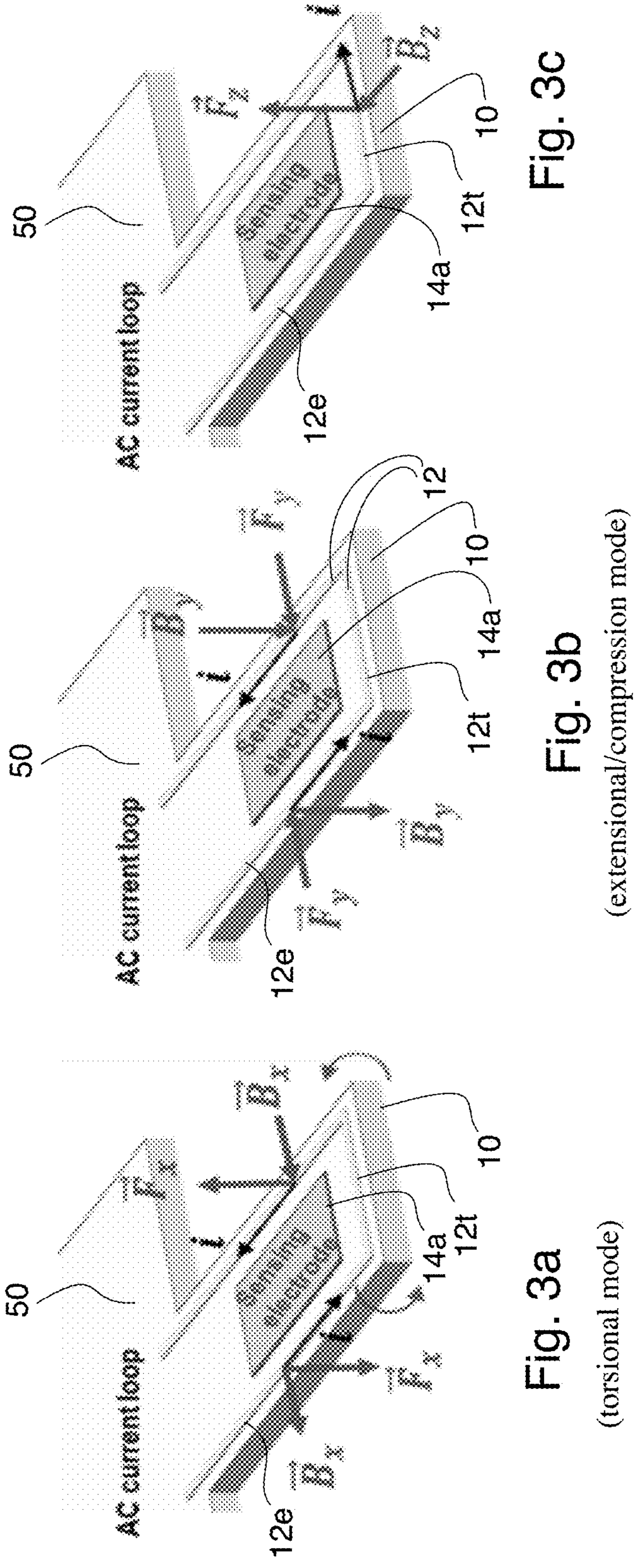
FIGS. 3*a*, 3*b* and 3*c* demonstrate that each field component (x,y, and z) can excite the beam into specific drive modes (torsional, extensional, flexural) depending on the frequency of the drive current in the loop.

As illustrated in FIGS. 3*a*, 3*b* and 3*c*, the quartz magnetometer or resonator comprises a resonating quartz plate 10 with the integrated top and bottom sense or sensing electrodes placed near the center of the plate (between the loop conductors 12*e*) and close to where the quartz plate 10 transitions from a cantilevered beam to the wider quartz base 50. The thickness shear frequency gets shifted, resulting in the side bands as disclosed in U.S. patent application Ser. No. 14/997,160 filed on the same date as this application and entitled "Quartz Magnetometer having a Quartz Resonant Plate with a Broaden Distal End for Enhanced Magnetic Sensitivity", as sensed by the electrodes 12*a* and 12*b*. The sense electrodes 12*a* and 12*b* detect stress on the beam, an absolute vibration displacement. So these electrodes 12*a* and 12*b* should preferably be placed as close as reasonably possible to the where the cantilevered beam 10 is anchored (which where it should see the highest stress concentration), namely, in this embodiment, at or near the transition point between the rectangular base 50 and the cantilevered beam 10.

The conductive current loop 12 is positioned near the edges of the plate 10. An AC current propagating along the loop conductor 12 interacts with the three orthogonal magnetic vector components Bx, By, and Bz and generates Lorenz forces that are the cross product of the current line and vector field components. The direction of the Lorentz force depends on the specific vector component of the magnetic field. The Bx vector (see FIG. 3*a*) interacts with the current propagation along the two sides of the plate 10 to create opposing Lorentz forces which result in a torsional bending of the plate. The By component (see FIG. 3*b*) is normal to the plate and creates Lorentz force that excites an extensional/compression mode of the plate 10. The Bz component (see FIG. 3*c*) interacts mainly with the current propagation at the tip 12*t* to excite an out-of-plane bending mode of plate 10, which induces a shear strain in plate 10 near or at its point of integrally mating with the wider quartz base 50.

To detect each vector field component separately for a single device, without cross talk, requires decoupling the three drive modes by implementing a closed loop operation of the current drive where the frequency is locked to the specific modal frequency. The sensor response to a specific component of the magnetic field depends on the frequency of the ac drive current in loop 12 and to which mechanical vibratory mode the drive current frequency is matched. Multiplexing the drive current signal frequency allows the magnetometer to quickly ascertain each field component strength before shifting to the next modal frequency.

Figure 4:
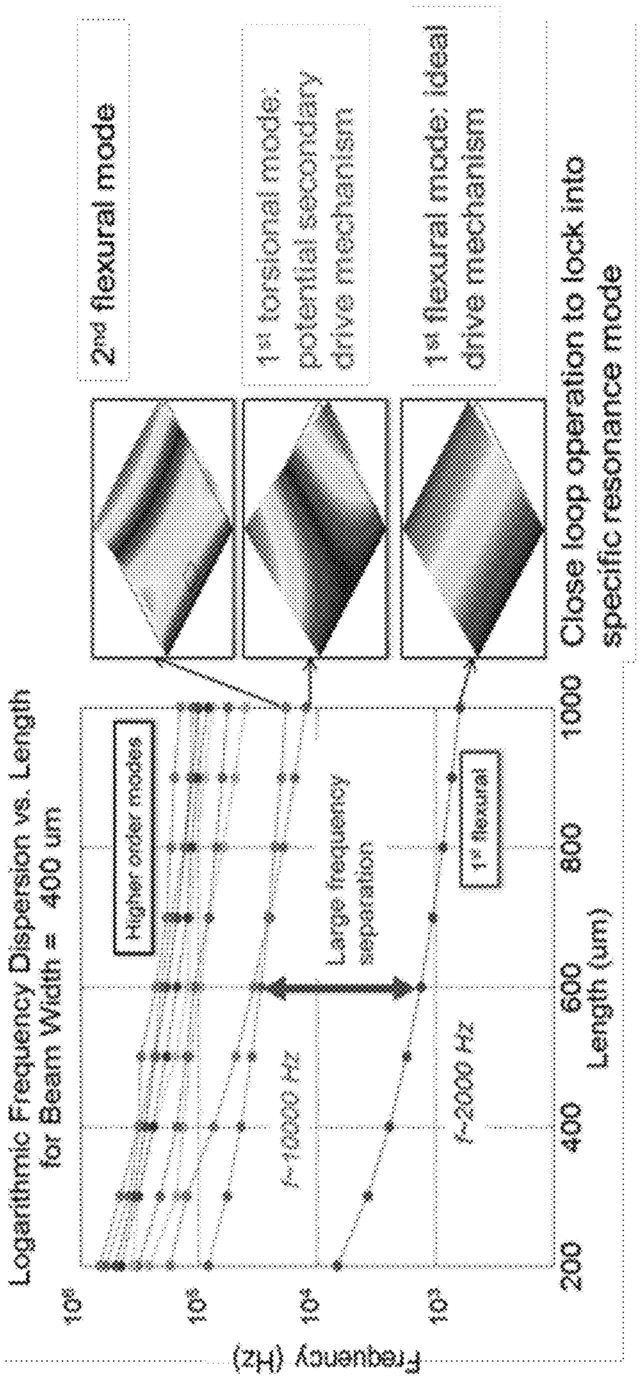
FIG. 4 shows the frequency dispersion of the various modes that a nominal quartz plate can support based on its dimensions.

FIG. 4 shows the frequency dispersion of the various modes that a nominal quartz plate can support based on its dimensions. The frequency separation between the lowest modes illustrates the possibility of exciting a particular mode at its resonance frequency without cross coupling to neighboring modes. The finite element analysis of the eigenmodes show the fundamental flexural, torsional, and $2^{nd}$ order flexural modes occupying the lower frequency range. These modes currently represent the drive modes due to the Bx and Bz components shown in FIGS. 3*a* and 3*c*. The extensional/compressional mode (FIG. 3*b*) used to sense the By component was not considered when this analysis was originally undertaken and thus was not identified at that time. It is believed that it certainly will be a higher frequency than the other two modes.

Figure 5:
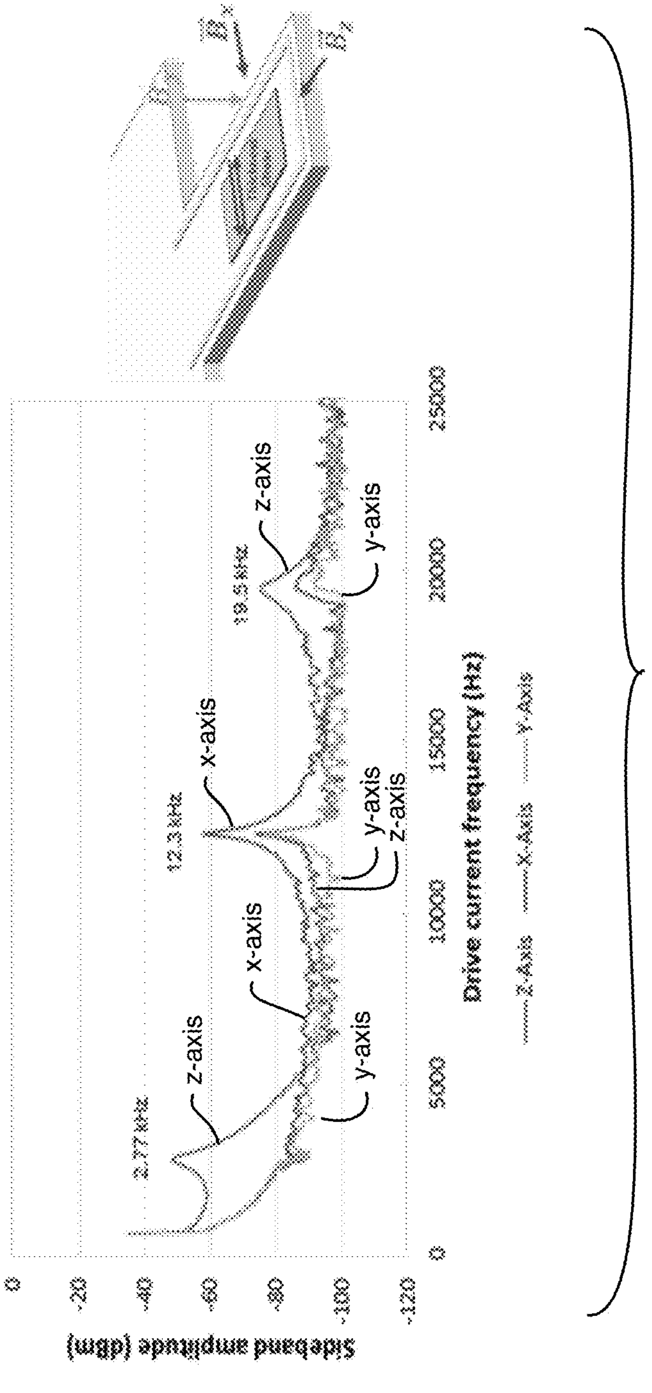
FIG. 5 is a graph depicting the sensor's response to the three vector components of the magnetic field as the drive current frequency is swept from DC to 25 kHz.

The present quartz magnetometer design supports two-axis detection by exciting its fundamental flexure and torsional modes. FIG. 5 depicts the magnetometer's response to the three vector components of the magnetic field as the drive current frequency is swept from DC to 25 kHz. Note the peaks which can be sensed. The magnetometer was placed in a 3-axis Helmholtz coil which can nullify the background magnetic field before generating a known and stable field along each of the three orthogonal axes. Each labeled trace represents the sensor response to a field along the Bz, Bx, and By components at constant current amplitude by varying drive current frequency in the loop 12. When the drive current frequency matches that of the fundamental flexure drive mode (2.77 kHz) the sensor becomes predominantly sensitive to the Bz component. The sensitivity ratio between the Bz and the other components is 30 dB. When the drive current frequency is set close to the torsional mode (12.3 kHz) of the quartz plate 10, the response to the Bx dominates. Sensitivity to the By component is theoretically possible since by setting the drive current frequency close to the extensional vibratory mode of the quartz plate, the sensor should becomes predominantly sensitive to the By component. The magnetometer can be driven by a single ac drive signal whose frequency toggles between different modal frequencies. Soak time at each modal frequency depends on the response time of the magnetometer.

The quartz beam 10 of the magnetometer used to produce FIG. 5 was AT-cut, although it is believed that other quartz cuts and indeed other materials can alternatively be used for beam 10. The quartz plate 10, in this embodiment, had a thickness t of 2.5 μm and a length of 600 μm. The width of the quartz plate 10 was was 431 and 590 μm at the base and free end, respectively, in this particular embodiment. Of course, these dimensions may be changed as needed for particular implementations.

The flexure, torsional and extensional frequencies noted above are preferably the natural frequencies of the quartz (with electrodes 14*a* & 14*b* and loop conductor 12 formed thereon) in these different vibrational modes. The beam 10 should be sized such that these flexure, torsional and extensional fundamental frequencies are outside their respective 3 db bandwidth peaks (see FIG. 5), for example.

There are two ways of carrying out the sensing suggested above. First, frequency mixing: overlay two different signals (or three) together so the drive current in loop 12 will excite the two (or three) modes simultaneously. This can be done, for example, with amplitude modulation of f1(flexure) and f2(torsional) multi-mode operation see: (a) Zhang, Xuehui, Huaxiang Wang, Shenghua Chen, and Yan Zhang. "FPGA-Based Multi-Frequency Excitation and Modulation Technology in EIT System" in 2010 3*rd International Conference on Biomedical Engineering and Informatics* (*BMEI*), 2:907-11, 2010. doi:10.1109/BMEI. 2010.5639879 or (b) Younis, Mohammad I. "Multi-Mode Excitation of a Clamped-clamped Microbeam Resonator." *Nonlinear Dynamics* 80, no. 3 (May 2015): 1531-41. doi:10.1007/s11071-015-1960-1. Second, multiplex or toggle the signal where for a specific duration delta t1, the drive current is at one frequency but then switch to a different frequency for another duration delta t2 and, if three axes are to be sensed, then switch to yet a different frequency for another duration delta t3.

So, one can either drive the current in loop 12 at the three frequencies sequentially or one can drive the current in loop 12 at the different frequencies simultaneously. Obviously, a circuit driving the current in loop 12 at the three fundamental frequencies sequentially should be easier to implement than driving them simultaneously and also should reasonably easy to implement by an electronic circuit.

Having now described the invention in accordance with the requirements of the patent statutes, those skilled in this art will understand how to make changes and modification s to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable.

Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims.

No claim element herein is to be construed under the provisions of 35 U.S.C. § 112(f), unless the element is expressly recited using the phrase "means for . . . " and no method or process step herein is to be construed under those provisions unless the step, or steps, are expressly recited using the phrase "comprising the step(s) of . . . ".

What is claimed is:

1. A magnetometer comprising a resonating bar structure which is naturally resonant in at least two different resonant modes, the resonating structure having at least one pair of sense electrodes disposed on opposing major surfaces of the resonating bar structure and having a conductive path formed as a conductive loop disposed on at least one of the major surfaces of the resonating bar structure, and the at least one pair of sense electrodes being formed inwardly of edges of the resonating bar structure and also inwardly of said loop.

2. A magnetometer as claimed in claim 1 wherein the resonating bar structure comprises a bar of piezoelectric material.

3. A magnetometer as claimed in claim 2 wherein the piezoelectric material is single crystal quartz.

4. A magnetometer as claimed in claim 3 wherein the resonating bar structure is a resonating beam anchored to a substrate at a proximate end thereof and free at a distal end thereof.

5. A magnetometer as claimed in claim 1 wherein the sense electrodes are positioned near a fixed end of the resonating beam.

6. A magnetometer as claimed in claim 1 wherein, in use, an oscillating current is applied to said loop and the magnetometer is placed to sense an external magnetic field.

7. A magnetometer as claimed in claim 6 wherein the oscillating current exhibits three different frequencies which occur sequentially.

8. A magnetometer as claimed in claim 7 wherein the three different frequencies correspond to the flexure, torsional and extensional natural frequencies of the resonating bar structure.

9. A magnetometer as claimed in claim 8 wherein the resonating bar structure comprises a cantilevered beam.

10. A magnetometer as claimed in claim 9 wherein the cantilevered beam comprises a plate of quartz material.

11. A resonating structure formed of a beam or plate of a piezoelectric material, the beam or plate of piezoelectric material being naturally resonant in at least two resonant modes, the resonating structure having at least one pair of sense electrodes disposed on opposing major surfaces of the beam or plate of piezoelectric material and having a conductive path disposed in a loop on at least one major surface of said beam or plate of piezoelectric material, the loop being disposed adjacent edges of the beam or plate of piezoelectric material and the at least one pair of sense electrodes being formed inwardly of the loop.

12. A resonating structure as claimed in claim 11 wherein the beam or plate of piezoelectric material is quartz.

13. A resonating structure as claimed in claim 11 wherein the piezoelectric material is single crystal quartz.

14. A resonating structure as claimed in claim 13 wherein the beam or plate of piezoelectric material is anchored to a substrate at a proximate end thereof and free at a distal end thereof.

15. A resonating structure as claimed in claim 11 wherein the at least one pair of sense electrodes which is formed inwardly of the loop is at or near a point of maximum resonant mode strain.

16. A resonating structure as claimed in claim 11 wherein the conductive path is a continuous path of metallic material from a first end of said loop to a second end of said loop with no semiconductor devices connected in said loop between said first and second ends, the continuous path of metallic material between said first and second ends being disposed on at least one major surface of said beam or plate of piezoelectric material.

17. A resonating structure as claimed in claim 11 wherein the beam or plate of piezoelectric material has a greater width at a distal end than at a proximal end, thereby defining a trapezoidal shape.

18. A magnetometer as claimed in claim 1 wherein the conductive path is formed of a continuous loop of metallic material disposed on a major surface of the resonating bar structure and wherein, in use, the conductive path has an AC signal applied thereto, the AC signal having a frequency during at least one time interval which is equal to a resonant frequency of one of the at least two different resonant modes of said resonating bar structure.

19. A magnetometer as claimed in claim 1 wherein the conductive path which is disposed on a major surface of the resonating bar structure is, in use, connected to an AC current.

20. A magnetometer as claimed in claim 19 wherein, in use, the magnetometer is exposed to a magnetic field having at least two orthogonal vector components Bx and By, wherein the Bx vector component interacts with the AC current propagating along a portion of said loop adjacent two sides of the resonating bar structure to create opposing Lorentz forces which result in a torsional bending of the resonating bar structure, and wherein the By vector component creates a Lorentz force that excites an extensional/compression mode of the resonating bar structure.

21. A magnetometer as claimed in claim 20 wherein the magnetic field to which the magnetometer is exposed, in use, also has a third orthogonal vector component Bz, the Bz vector component interacting with the AC current propagation along another portion of the loop between the two sides of the resonating bar structure and adjacent a distal end of the resonating bar structure to create Lorentz forces which result in an out-of-plane bending mode of the resonating bar structure.

* * * * *